United States Patent [19]

Brice et al.

[11]  4,092,208
[45]  May 30, 1978

[54] METHOD OF GROWING SINGLE CRYSTALS OF RARE EARTH METAL IRON GARNET MATERIALS

[75] Inventors: John Chadwick Brice, Salfords, England; John Mackay Robertson, Eindhoven, Netherlands

[73] Assignee: U.S. Philips Corporation, New York, N.Y.

[21] Appl. No.: 794,393

[22] Filed: May 6, 1977

Related U.S. Application Data

[63] Continuation of Ser. No. 633,283, Nov. 19, 1975, abandoned.

[30] Foreign Application Priority Data

Nov. 27, 1974  United Kingdom ............... 51392/74

[51] Int. Cl.$^2$ .................... B01J 17/18; C01F 17/00
[52] U.S. Cl. .................... 156/624; 156/622; 156/617 SP; 156/DIG. 63; 156/DIG. 79; 423/263; 423/594; 423/600; 427/128
[58] Field of Search .................. 423/263, 594, 600; 156/617 SP, 622, 624, DIG. 63, DIG. 69, DIG. 79; 427/127, 128, 430 R, 43 B; 428/539, 543, 900

[56] References Cited

U.S. PATENT DOCUMENTS

| 3,697,320 | 10/1972 | Hickes | 423/594 |
| 3,790,405 | 2/1974 | Levinstein | 156/624 |
| 3,915,661 | 10/1975 | Vichi | 156/622 |
| 3,947,372 | 3/1976 | Shinagawa et al. | 423/594 |

OTHER PUBLICATIONS

Wanklyn, "Chem. Abstracts," vol. 73, 1970, #102732q.

*Primary Examiner*—Herbert T. Carter
*Attorney, Agent, or Firm*—Frank R. Trifari; Norman N. Spain

[57] ABSTRACT

A method of growing monocrystalline bismuth rare earth iron garnet, either as a single crystal or as an epitaxial layer, from a solution containing composing components of the garnet together with a flux. The flux consists essentially of a mixture of $Bi_2O_3$ and $RO_2$, wherein R is at least one of the elements Si, Ge, Ti, Sn, Zr, Ce and Te, wherein the system $Bi_2O_3$—$RO_2$ includes a eutectic composition having a eutectic temperature which is below the melting temperature of pure $Bi_2O_3$. By using these $Bi_2O_3$—$RO_2$ fluxes, the monocrystalline garnets produced have lower optical absorption coefficients at, for example 5100 A and 5600 A than similar garnets grown using lead-containing fluxes. Furthermore higher growth rates and higher growth temperatures are possible when using the $Bi_2O_3$—$RO_2$ fluxes rather than lead-containing fluxes.

5 Claims, 1 Drawing Figure

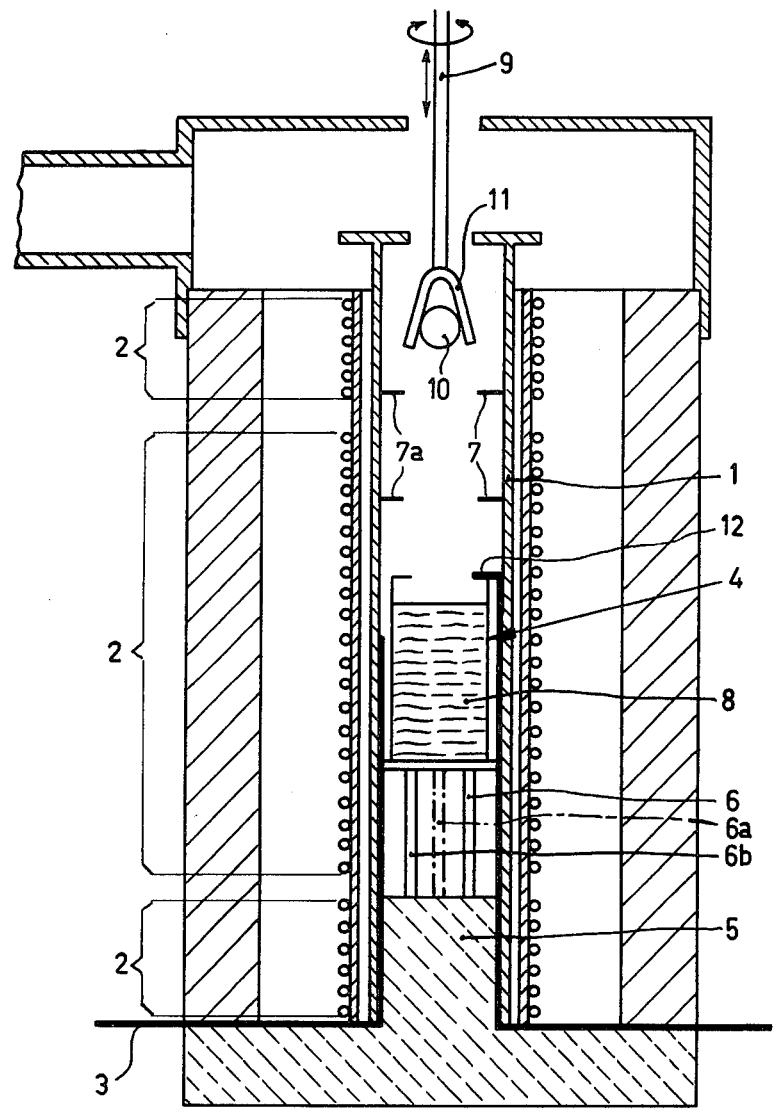

METHOD OF GROWING SINGLE CRYSTALS OF RARE EARTH METAL IRON GARNET MATERIALS

This is a continuation of application Ser. No. 633,283, filed Nov. 19, 1975, now abandoned.

The invention relates to a method of growing a monocrystalline rare earth iron garnet material either as a single crystal or as a monocrystalline epitaxial layer from a melt which consists of a solution containing the composing components for the garnet material and a flux, to a single crystal grown by such a method, and to a substrate bearing a monocrystalline epitaxial layer grown by such a method.

In the last few years, there has been an increasing interest in single crystals of rare earth iron garnet materials and in particular in monocrystalline thin films of such garnet materials. Throughout this specification, elements having the atomic numbers 21, 39 and 57 to 71 inclusive are considered to be rare earth elements. These monocrystalline thin films are used, for example, in magnetic bubble domain devices, in integrated optical circuits which are operative for conducting and manipulating information-carrying light waves, and in devices for thermomagnetic recording and magneto-optical reading of information. It is known from U.S. Pat. No. 3,697,320 that various techniques are available to manufacture iron garnet single crystals. Epitaxial film growth methods have proved to be particularly suitable for making monocrystalline layers of these iron garnet materials. In these methods, for example, the layers may be grown by epitaxy from the liquid phase, so-called "liquid phase epitaxy" (LPE). In these methods growth takes place in a dipping device in which a monocrystalline garnet substrate is contacted with a melt containing a suitable solution of rare earth and iron oxides, and any other oxides if these are required. The substrate crystals are usually grown from a substantially stoichiometric melt by means, for example of the Czochralsky method. A solvent frequently used in LPE methods and in other flux growth methods is a flux which contains PbO, possibly with the addition of $PbF_2$ and/or $B_2O_3$ so as to control the dissolving power, the crystallization rate and the temperature range over which the crystallization is carried out (see Netherlands Patent Application Nos. 7,301,311 and 7,115,765). A lead-containing flux has proved to be particularly suitable for growing magneto-optically active garnet layers, which, in order to increase their magneto-optical effect, contain bismuth, because this enables the low growth temperature which is necessary to grow sufficient bismuth in the garnet film. According as the growth temperature is lower, more bismuth grows in the film (see Dutch Patent Application No. 7,213,623).

The use of lead-containing fluxes, however, suffers from the drawback that the grown film also comprises lead which causes a considerable optical absorption. However, films having the minimum possible optical absorption are required, notably for magneto-optical applications. Lead-free fluxes have been used to manufacture such films but the fluxes known hitherto generally exhibit the drawback of having a high viscosity at the desired growth temperature. This means inter alia that, when the substrate bearing the epitaxial layer of garnet is removed from the melt, a quantity of the flux easily adheres to the coated substrate which is detrimental to the perfection of the epitaxial layer. In addition, a high viscosity may give rise to inhomogeneities in the melt and hence in the composition of the grown film. When such a high growth temperature is chosen that the viscosity of the flux is sufficiently low to be useful, it is found that little or no bismuth is incorporated in the film.

It is the object of the invention to provide a lead-free flux which does not exhibit the above-mentioned drawbacks.

The invention provides a method of growing a monocrystalline bismuth rare earth (as hereinbefore defined) iron garnet as a single crystal or as an epitaxial layer from a melt consisting of a solution containing the constituents of the garnet, wherein the solution contains a flux consisting essentially of a mixture of $Bi_2O_3$ and $RO_2$, wherein R is at least one of the elements Si, Ge, Ti, Sn, Zr, Ce and Te, wherein the mixture of $Bi_2O_3$ and $RO_2$ includes a eutectic composition having a eutectic temperature which is below the melting temperature of pure $Bi_2O_3$. Within the scope of the present invention, said combinations constitute suitable fluxes for growing perfect rare earth-iron garnet single crystals comprising bismuth in a part of the rare-earth lattice sites. (It is to be noted that up to 50% of the iron may be replaced by, for example, aluminum or gallium.)

Although said fluxes are useful for flux growth methods in general, for example the methods described in U.S. Pat. No. 3,697,320, they are particularly suitable for growth by liquid phase epitaxy.

The invention therefore relates in particular to a method in which a monocrystalline bismuth rare earth iron garnet layer is grown from a melt of the above-described composition on a crystal face by liquid phase epitaxy, which layer shows the crystallographic orientation of said crystal face, by contacting the crystal face with the melt and causing a layer of the composition of the layer to crystallize on the crystal face.

Within the scope of the invention, flux compositions can be chosen such that growth at temperatures between 720° and 900° C is possible. This is important when the grown material contains bismuth. The growth temperature for growing bismuth-containing rare earth-iron garnet material is preferably between 720° and 900° C. Preferably the viscosity of the flux mixture at the growth temperature is not more than 16 centipoises. (The viscosity of pure $Bi_2O_3$, the use of which as a flux is known from Netherlands Patent Application No. 7,115,765, is only lower than 16 centipoises at temperatures above 900° C).

An advantage of the use of the fluxes according to the invention is that the bismuth rare earth iron garnet layers grown with them have a considerably lower magnetic anisotropy than bismuth rare earth iron garnet layers grown by means of lead fluxes. The use of bismuth rare earth iron garnet layers having a low magnetic anisotropy is important in devices for thermomagnetic recording of information.

A thermomagnetic device including a substrate bearing a monocrystalline layer of a bismuth rare earth iron garnet material deposited by the method according to the invention, may use a garnet layer having a low uniaxial anisotropy.

Some embodiments of the invention will now be described with reference to the single FIGURE of the accompanying drawing and to Examples 1 to 4. Example A is outside the scope of the invention and is included for purposes of comparison. The FIGURE is a sectional elevation of an apparatus used to grow a monocrystalline layer by liquid phase epitaxy.

Apparatus and Growth Procedure

The apparatus includes a furnace having a main ceramic tube 1 which is 35 cms. long and has an internal diameter of 6.5 cms. The furnace has a three-zone heating element 2 and by the use of three variable output transformers (not shown) it is possible to obtain a desired vertical temperature gradient. The transformers are controlled by a single Eurotherm controller (not shown) with the aid of a sensing thermocouple 3 near the middle heater zone A 100 ml. platinum crucible 4 is supported on an alumina pedestal 5, but separated from it by three alumina limbs 6, 6a and 6b so that there is an air space beneath the crucible. A platinum wire 12 clamped to the top of the crucible 4 grounds the crucible so as to avoid interference with the thermocouple 3. The position of the crucible within the furnace is such that it is slightly lower than the middle of the middle heater zone. Above the crucible are two sets of platinum baffles 7 and 7a. By varying the spacing of these baffles, the fume extraction flow rate, the size of the air space beneath the crucible and by a suitable adjustment of the vertical temperature gradient, it is possible to minimize the convection currents in a melt 8 caused by radial temperature gradients. These radial temperature gradients can be reduced by using good insulation of the furnace. The vertical temperature gradient is such that the top of the crucible is hotter than the bottom by up to 10° C depending upon the size of the crucible. The convection in the melt 8 can be controlled over a 20 mm. diameter substrate.

Many workers rotate the substrate in the horizontal plane during film growth and there may be certain advantages in doing this. The apparatus described can also be used for this horizontal technique.

A typical method of growing an epitaxial layer is as follows. The melt composition is first homogenised at a temperature approximately 50° C above the temperature at which the garnet crystal will cease to grow. The homogenization process may be accelerated by using a platinum paddle (not shown) fitted in place of a substrate holder 9 and rotated in the melt 8 usually for approximately 1 hour. The rotation rate of the paddle is controlled by an electronic system which enables unidirectional rotation at up to 600 rpm. or accelerated rotation and reversal controlled by a function generator.

After the homogenisation period, the platinum paddle is removed from the melt and the furnace temperature is reduced to that required for film growth. Half an hour may elapse after the furnace has reached this temperature so that equilibrium conditions can establish in the melt 8. A substrate 10 which has been previously cleaned (using ultrasonics with organic cleaning agents) is placed into a specimen clamp 11. This in turn is connected to a lowering mechanism (not shown).

The substrate 10 is lowered into the furnace at a rate of 40 mm/min. This is continued until the substrate is hanging directly above the surface of the melt 8. The substrate is held in this position for from 1 to 5 minutes so that it acquires the same temperature as the melt 8. At the end of this period, the substrate 10 is lowered into the melt 8 and is rotated fairly fast so that there is not a substantial difference between the times of immersion of the upper and lower parts of the substrate when the substrate has been disposed in the vertical plane.

When the substrate holder 9 is in its desired position, the lowering mechanism is stopped, and rotation of the substrate holder 9 continues, if required.

When the deposition time is completed, the coated substrate 10 is removed from the melt. The removal rate of the coated substrate 10 into the cooler regions of the furnace is 40 mm/min until the coated substrate 10 is outside the furnace and may be removed from the apparatus.

Example A

A 3.21 μm thick layer of $(BiTm)_3(FeGa)_5O_{12}$ was grown in 30 minutes on both sides of a substrate of $Gd_3Ga_5O_{12}$ by means of a dipping process using the apparatus described above with reference to the FIGURE. A melt was prepared consisting of 163.47 g $Bi_2O_3$
319.70 g PbO
3.53 g $Tm_2O_3$
25.62 g $Fe_2O_3$
4.005 g $Ga_2O_3$ The temperature at which the layer was grown was between 720° and 770° C. The substrate was not rotated. The resulting layer was epitaxial, monocrystalline, smooth, uniform in composition and thickness and free from defects.

EXAMPLE 1

A 4.6 μm thick layer of $(BiTm)_3(FeGa)_5O_{12}$ was grown in 10 minutes on both sides of a substrate of $Gd_3Ga_5O_{12}$ by means of a dipping process using the apparatus described above with reference to the FIGURE. A melt was prepared consisting of 232.98 g $Bi_2O_3$
0.60 g $SiO_2$
3.53 g $Tm_2O_3$
11.00 g $Fe_2O_3$
2 g $Ga_2O_3$ The substrate was rotated at a speed of 170 rpm.

The temperature at which the layer was grown was between 820° and 870° C. The resulting layer was epitaxial, monocrystalline, smooth, uniform in composition and thickness and free from defects.

EXAMPLE 2

A 3.1 μm thick layer of $(BiTm)_3(FeGa)_5O_{12}$ was grown in 5 minutes on both sides of a substrate of $Gd_3Ga_5O_{12}$ by means of a dipping process using the apparatus described above with reference to the FIGURE. A melt was prepared consisting of 232.98 g $Bi_2O_3$
1.044 g $GeO_2$
3.53 g $Tm_2O_3$
11.0 g $Fe_2O_3$
3.5 g $Ga_2O_3$ The temperature at which the layer was grown was between 820° and 870° C. The substrate was not rotated. The resulting layer was epitaxial, monocrystalline, smooth, uniform in composition and thickness and was free from defects.

EXAMPLE 3

A 13.7 μm thick layer of $(BiTm)_3(FeGa)_5O_{12}$ was grown in 30 minutes on both sides of a substrate of $Gd_3Ga_5O_{12}$ by means of a dipping process using apparatus as described above with reference to the FIGURE. A melt was prepared consisting of 232.98 g $Bi_2O_3$
0.86 g $GeO_2$
3.53 g $Tm_2O_3$
11.00 g $Fe_2O_3$
4.00 g $Ga_2O_3$.

The substrate was not rotated. The temperature at which the layer was grown was approximately 875° C. The resulting layer was epitaxial, monocrystalline, smooth, uniform in composition and thickness and free from defects.

EXAMPLE 4

A 1.6 μm thick layer of $(BiGd)_3(FeGa)_5O_{12}$ was grown in 30 minutes on both sides of a substrate of $Gd_3Ga_5O_{12}$ by means of a dipping process using the apparatus described above with reference to the FIGURE. A melt was prepared consisting of 232.98 g $Bi_2O_3$
0.6 g $SiO_2$
3.32 g $Gd_2O_3$
11.00 g $Fe_2O_3$
3.00 g $Ga_2O_3$.

The temperature at which the layer was grown was between 820° and 870° C. The substrate was not rotated. The resulting layer was epitaxial, monocrystalline, smooth, uniform in composition and thickness and free from defects.

The optical absorption coefficients α upon irradiation of the layers produced in Examples 1, 3 and 4 with light of a wavelength of 5100 A, 5600 A and 6235 A, respectively, were measured and related to the absorption coefficient upon irradiation of the Example A layer light of a wavelength of 5100 A (of the layer of Example 1). The relative values found are shown in Table 1. It will be noted that the values of α for Examples 1, 3 and 4 at wavelengths of 5100 A and 5600 A are significantly lower than the values for Example A at the same wavelength.

Furthermore it will be noted that the rate of growth of the $(BiTm)_3(FeGa)_5O_{12}$ layers and the growth temperatures in Examples 1 and 3 were significantly higher than the rate of growth and growth temperature in Example A. The bismuth contents of the layers grown by the methods described in Examples 1 to 4 were similar to the bismuth content of the layer grown by Example A.

TABLE 1

|  | Example A | Example 1 | Example 3 | Example 4 |
|---|---|---|---|---|
| α5100 | 100 | 57.1 | — | 44.6 |
| α5600 | 20.6 | 13.8 | 14.0 | 14.3 |
| α6235 | 9.4 | 9.6 | 8.3 | 10.0 |

A second series of films was manufactured from the same melts as those used in Examples A, 1 and 2. The anisotropy field $K_u$ of these films was measured. The values found, expressed in erg/ccm., are shown in the table below.

TABLE 2

|  | Example A | Example 1 | Example 2 |
|---|---|---|---|
| $K_u$ | $13.1 \times 10^3$ | $1.1 \times 10^3$ | $1.1 \times 10^3$ |

All measurements were carried out at room temperature.

For further information on the system $Bi_2O_3$—$RO_2$, reference is made to the phase diagrams published by E. M. Levin and R. S. Roth in J. Research Natl. Bur. Standards, 68A(2) 201 (1964).

Dependent on the quantity added, additions of the oxides of Si, Ge, Ti, Sn, Zn, Ce and Te to $Bi_2O_3$ prove to reduce the viscosity of the mixture. A number of viscosity measurements (expressed in centipoises) were made with such mixtures and are shown in Table 3, the additions being expressed in mol.%.

TABLE 3

| Temp. (° C) | $Bi_2O_3$ | $Bi_2O_3$ + 3% $SiO_2$ | $Bi_2O_3$ + 14.7% $SiO_2$ | $Bi_2O_3$ + 5% $TiO_2$ | $Bi_2O_3$ + 10% $TiO_2$ | $Bi_2O_3$ + 15% $TiO_2$ | $Bi_2O_3$ + 2% $CeO_2$ |
|---|---|---|---|---|---|---|---|
| 820 |  | 16.6 |  |  |  |  |  |
| 840 |  |  |  | 10.2 |  |  |  |
| 860 |  | 11.1 |  |  |  |  |  |
| 900 |  | 8.0 |  |  |  |  |  |
| 915 | 15.5 |  | 20 | 8.9 | 8.8 |  | 10.5 |
| 940 |  |  |  | 7.6 |  |  | 8.2 |
| 975 | 13.5 |  | 12.7 |  | 7.3 | 7.9 | 7.2 |
| 1020 | 11.5 |  | 10.9 |  | 6.9 | 6.5 |  |

Substrates consisting for example of a monocrystalline garnet and bearing a monocrystalline epitaxial bismuth rare earth iron garnet grown by the method according to the invention may be used, for example, in a thermomagnetic device, for example as outlined by J. P. Krumme et al in Appl. Phys. Letts. 20, 451 (1972), or in a magneto-optical device (see our co-pending application 46375/73), or in a magneto-optical bubble domain device (see an article by G. S. Alami in I.E.E. Trans. Mag. MAG-7,370 (1971)), or in a magnetic bubble domain device of the types mentioned by A. H. Bobeck, R. F. Fischer and J. L. Smith in AIP Conference Proc. No. 5, 45 (1971).

What we claim is:

1. In the method of growing a monocrystalline bismuth rare earth iron garnet from a melt consisting of a solution containing the constituents of the garnet by crystallization from said melt, the improvement wherein the solution in addition to said constituents contains a flux consisting essentially of a mixture of $Bi_2O_3$ and $RO_2$ wherein R is at least one element selected from the group consisting of Si, Ge, Ti, Sn, Zr, Ce and Te the proportion of $Bi_2O_3$ and $RO_2$ being such as to form a eutectic composition the eutectic temperature of which is below the melting temperature of pure $Bi_2O_3$ and the proportion of $Bi_2O_3$ in the solution being in excess of that required as a constituent of the garnet.

2. A method of claim 1, wherein a monocrystalline bismuth rare earth iron garnet epitaxial layer is grown by crystallization from the melt on a crystal face of a monocrystalline substrate.

3. A method as claimed in claim 1, wherein the growth temperature is between 720° and 900° C.

4. A method as claimed in claim 3, wherein the viscosity of the flux mixture at the growth temperature is not more than 16 centipoises.

5. The method of claim 4 wherein a monocrystalline epitaxial layer of a bismuth rare earth iron garnet is grown on a crystal face of a mono-crystalline substrate.

* * * * *